United States Patent [19]
Shen et al.

[11] Patent Number: 5,640,698
[45] Date of Patent: Jun. 17, 1997

[54] RADIO FREQUENCY SIGNAL RECEPTION USING FREQUENCY SHIFTING BY DISCRETE-TIME SUB-SAMPLING DOWN-CONVERSION

[75] Inventors: David H. Shen, Saratoga; Chien-Meen Hwang, Stanford; Bruce B. Lusignan, Palo Alto; Bruce A. Wooley, Los Altos Hills, all of Calif.

[73] Assignee: Stanford University, Stanford, Calif.

[21] Appl. No.: 468,280

[22] Filed: Jun. 6, 1995

[51] Int. Cl.⁶ .................... H04B 1/22; H03D 3/18
[52] U.S. Cl. .................... 455/323; 455/339; 455/340; 375/316
[58] Field of Search .................... 455/313, 323, 455/338, 314–316, 339–340, 307; 375/350, 346, 316, 340

[56] References Cited

U.S. PATENT DOCUMENTS

| | | | |
|---|---|---|---|
| 4,733,403 | 3/1988 | Simone | 375/350 |
| 4,922,509 | 5/1990 | Tresset et al. | 375/350 |
| 5,222,144 | 6/1993 | Whikehart | 375/340 |
| 5,339,459 | 8/1994 | Schiltz et al. | 455/313 |
| 5,357,544 | 10/1994 | Horner et al. | 375/340 |
| 5,490,173 | 2/1996 | Whikehart et al. | 375/316 |
| 5,493,581 | 2/1996 | Young et al. | 375/350 |

FOREIGN PATENT DOCUMENTS

| | | | |
|---|---|---|---|
| WO90/04292 | 4/1990 | WIPO | 375/350 |

*Primary Examiner*—Reinhard J. Eisenzopf
*Assistant Examiner*—Lester G. Kincaid
*Attorney, Agent, or Firm*—Lumen Intellectual Property Services

[57] ABSTRACT

An RF communications receiver permits greater integration on standard silicon chips and consumes less power than previous receivers. Sub-sampling and discrete-time signal processing techniques are used to frequency down-convert, filter, amplify, and select a desired analog RF channel. A sample-and-hold circuit sub-samples the desired analog RF channel of carrier frequency $f_c$, thereby down-converting it to a discrete-time image signal of frequency $f_i$. Successive down-sampling, anti-alias filtering, and amplification of the discrete-time image signal yield a low-frequency discrete-time signal containing a down-converted channel of frequency $f_k$. The low-frequency discrete-time signal is then digitized, filtered, and demodulated to reveal its baseband information content.

24 Claims, 11 Drawing Sheets

RADIO FREQUENCY SIGNAL RECEPTION USING FREQUENCY SHIFTING BY DISCRETE-TIME SUB-SAMPLING DOWN-CONVERSION

BACKGROUND—TECHNICAL FIELD OF INVENTION

The present invention relates to radio receivers and methods for the reception of RF (radio frequency) communications signals. In particular, it relates to radio receivers using high-speed discrete-time electronic circuits and methods for RF signal reception using sub-sampling for frequency down-conversion.

BACKGROUND OF THE INVENTION AND DISCUSSION OF THE PRIOR ART

At the present time, the vast majority of RF communications receivers are of the traditional superheterodyne type. This type of receiver uses one or more IF (intermediate frequency) stages for filtering and amplifying signals at a fixed frequency within an IF chain. This radio architecture has the advantage that fixed filters may be used in the LO (local oscillator) chain.

A block diagram of a typical superheterodyne radio receiver is shown in FIG. 1. An RF signal arriving at an antenna 11 passes through a bandpass RF filter 13, an LNA (low noise amplifier) 15 and into an image filter 17 which produces a band-limited RF signal. This band-limited RF signal then enters a first mixer 19 which translates the RF signal down to an intermediate frequency by mixing it with the signal produced by a first LO (local oscillator) 21. The undesired mixer products in the IF signal are rejected by an IF filter 23. The filtered IF signal then enters a second mixer 25 which translates it down to yet another intermediate frequency by mixing it with the signal produced by a second LO 27. The signal finally passes through an IF amplifier 29 and an IF filter 31, resulting in a channelized IF signal, i.e., a signal containing a particular channel isolated from the other channels present within the original band-limited RF signal. An analog demodulator 33 demodulates the channelized IF signal into a baseband information signal. Tuning into a particular channel within the band-limited RF signal is accomplished by varying the LO frequency of LO 21.

In order to reduce size, power consumption, and cost, it would be advantageous to integrate the electronic components of radio receivers onto a single silicon chip. The superheterodyne design, however, requires high-quality, narrowband IF bandpass filters operating at high frequencies, and these components can not be built on-chip with present technology. Instead, off-chip components such as SAW (surface acoustic wave) filters or tuned circuits requiring resonating components such as inductors or cavities must be used. These external filtering components impose a lower limit to the size, materials cost, assembly cost, and power consumption of receivers built using the superheterodyne design. Moreover, the necessity for mixer and local oscillator circuits operating at high frequencies contributes greatly to the power consumption and general complexity of the superheterodyne receiver. In particular, high-frequency analog mixers often require a large amount of power to maintain linear operation. Although many variations of the superheterodyne design exist, they all share the limitations of the particular design just described.

The growing demand for portable communications has motivated attempts to design radio receivers that permit the integration of more components onto a single chip. For example, a digital IF receiver design, as shown in FIG. 2, can be integrated further than the superheterodyne design and therefore requires fewer external components. As in the superheterodyne design, an antenna 35 couples an RF signal through an RF filter 37 into an LNA 39 and then through an image filter 41. The band-limited RF signal mixes in a mixer 43 with a LO signal from a LO 45 to produce an IF signal. The IF signal then is amplified in an IF amplifier 47 before being channelized in an IF filter 49. An ADC (analog-to-digital converter) 51, operating at a conversion rate determined by a clock circuit 53, digitizes the channelized IF signal into a digital IF signal. This digital IF signal is filtered and demodulated by a digital demodulator 55 and is passed on to the remainder of the communications system as a digital baseband information signal. Tuning is accomplished by varying the frequency of LO 45. Multiple techniques for performing the digital filtering and demodulation have been developed for this receiver design such as those described in U.S. Pat. Nos. 4,888,557 and 4,902,979.

Compared to the superheterodyne design, the digital IF design can cost less to manufacture and assemble because it has fewer off-chip components. Nevertheless, the digital IF design still requires several off-chip components, namely, external IF filters, a high-frequency mixer, and a high-frequency LO. U.S. Pat. No. 5,339,459 describes a technique that eliminates the necessity for external high-frequency mixer and LO circuits by using a sample-and-hold circuit. By operating at a sampling rate lower than the band-limited RF signal, i.e. by sub-sampling, the sample-and-hold circuit acts as a mixer to translate the RF signal into an IF signal. Although this technique allows further integration and lower power operation, it still requires the use of off-chip components for the high-quality, narrowband IF bandpass filters needed for channelization.

The digital IF design has other disadvantages as well. In order to faithfully digitize the analog signal, the ADC is required to operate at a conversion rate of at least twice the intermediate frequency. Such a high-frequency ADC consumes a large amount of power to maintain the required linearity and dynamic range. This becomes even more problematic for receiver designs in which the A/D conversion is performed at the front end of the receiver, e.g., as in U.S. Pat. No. 4,893,316.

A third receiver design is the direct-conversion, or zero-IF, receiver shown in FIG. 3. An antenna 57 couples an RF signal through a first bandpass RF filter 59 into an LNA 61. The signal then proceeds through a second RF filter 63, yielding a band-limited RF signal, which then enters a mixer 65 and mixes with an LO frequency produced by an LO 67. Up to this point, the direct-conversion receiver design is essentially the same as the two previous receiver designs.

Unlike the previous designs, however, the LO frequency is set to the carrier frequency of the RF channel of interest. The resulting mixer product is a zero-frequency IF signal-a modulated signal at baseband frequency. This signal couples into a lowpass analog filter 69 before proceeding into an analog demodulator 71 to yield the demodulated analog baseband information signal for use by the remainder of the communications system. Alternatively, an analog-to-digital converter can be inserted after mixer 65 and the filtering and demodulation can be done digitally, producing a digital baseband information signal for use by the remainder of the communications system. In either case, tuning is accomplished by varying the frequency of LO 67, thereby converting different RF channels to zero-frequency IF signals.

Because the direct-conversion receiver design produces a zero-frequency IF signal, its filter requirements are greatly simplified—no external IF filter components are needed since the zero-IF signal is an audio frequency signal that can be filtered by a low-quality lowpass filter. This allows the receiver to be integrated in a standard silicon process from mixer 65 onwards, making the direct-conversion receiver design potentially attractive for portable applications.

The direct-conversion design, however, has several problems, some of which are quite serious. As with the other designs described above, the RF and image filters required in the direct-conversion design must be high-quality narrowband filters that must remain off-chip. Moreover, this design requires the use of high-frequency mixer and LO circuits that require large amounts of power. Additionally, radiated power from LO 67 can couple into antenna 57, producing a DC offset at the output of mixer 65. This DC offset can be much greater than the desired zero-IF signal, making signal reception difficult. Radiated power from LO 67 can also affect other nearby direct-conversion receivers tuned to the same radio frequency. Furthermore, to receive signals transmitted using modulation techniques (such as FM) in which access to both the lower and upper sidebands is required, two mixers and two LOs are required to produce both an in-phase and a quadrature baseband signal. Not only does this increase the power required by the receiver, but also the phase between the two LO signals must be precisely maintained at 90 degrees to prevent demodulation distortion. This can be difficult to accomplish with variations in temperature and other operational parameters.

In summary, although the prior art includes various receiver designs that achieve successively greater integration, each one has significant disadvantages including one or more of the following: the necessity for several external circuit components, the consumption of large amounts of power, poor signal reception, interference with other receivers, distortion, and limited dynamic range.

OBJECTS AND ADVANTAGES OF THE INVENTION

Accordingly, it is a primary object of the present invention to provide a radio receiver design which has increased integration, decreased materials and assembly costs, and decreased power consumption without the operational problems associated with previous receiver designs. It is a further object of the invention to provide a method of frequency down-converting an RF channel without requiring any off-chip IF filter components, multiple LOs, high frequency LOs operating at frequencies near the RF signal frequency of interest, in-phase and quadrature LOs, analog mixers, or high-speed, high-power analog-to-digital converters. It is another object of the present invention to provide a method for filtering and selecting a particular channel within a channel allocation band of interest without requiring any off-chip IF components, especially components for filtering. Further objects and advantages will become apparent from a consideration of the ensuing description and drawings.

SUMMARY OF THE INVENTION

The present invention achieves the above objects and advantages by providing a new method for RF communications signal reception and a new receiver design that incorporates this method. This method includes filtering an RF signal containing a channel allocation band of bandwidth B to yield a band-limited RF signal of bandwidth W. An RF channel of carrier frequency $f_c$ is included within this channel allocation band. The method further includes a sample-and-hold means to sub-sample the band-limited RF signal at a sampling rate $f_s < f_c$ in order to obtain an image signal of the RF channel. The image signal frequency $f_i$ satisfies the conditions $f_i = nf_s \pm f_c$ and $f_s - 2f_i > (W+B)/2$, where n is an integer chosen to minimize $[f_i]$. Furthermore, the method includes a discrete-time down-converting means to successively down-convert, filter, and amplify the image signal of the RF channel to a low-frequency signal of frequency $f_k$. In contrast with digital signal processing techniques, the down-converting method of the invention employs discrete-time signal processing techniques that do not require digital conversion and processing of the signal.

DESCRIPTION OF THE PREFERRED EMBODIMENT—PHYSICAL ATTRIBUTES

Figure 1:
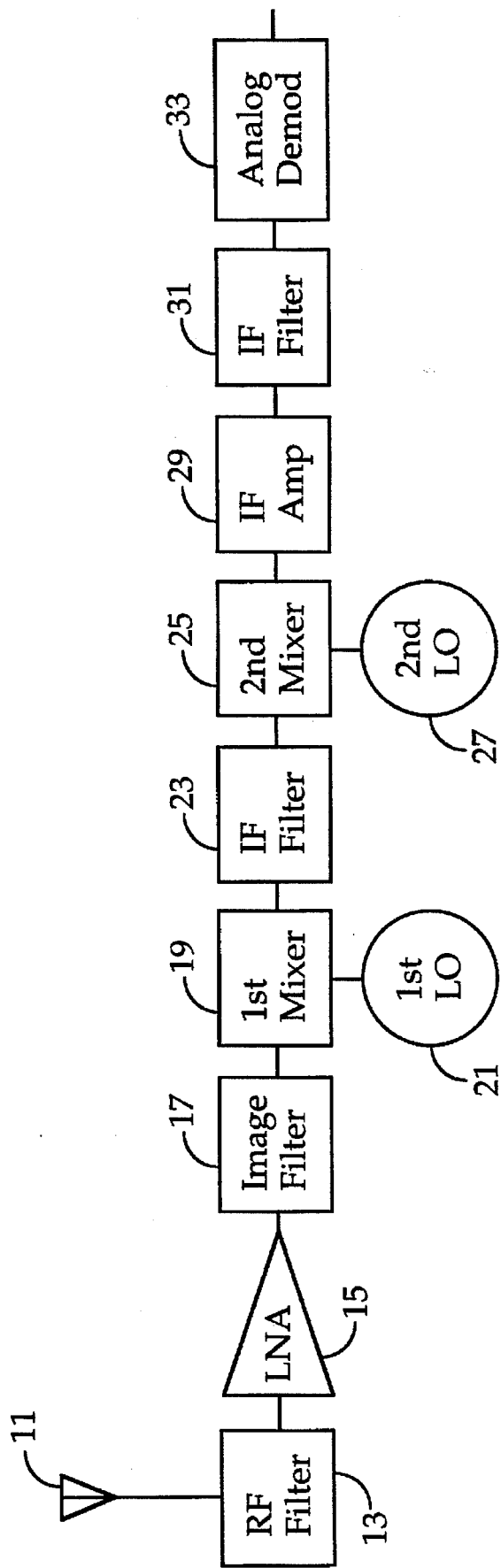
FIG. 1 is a block diagram of a superheterodyne receiver considered as prior art.
Figure 2:
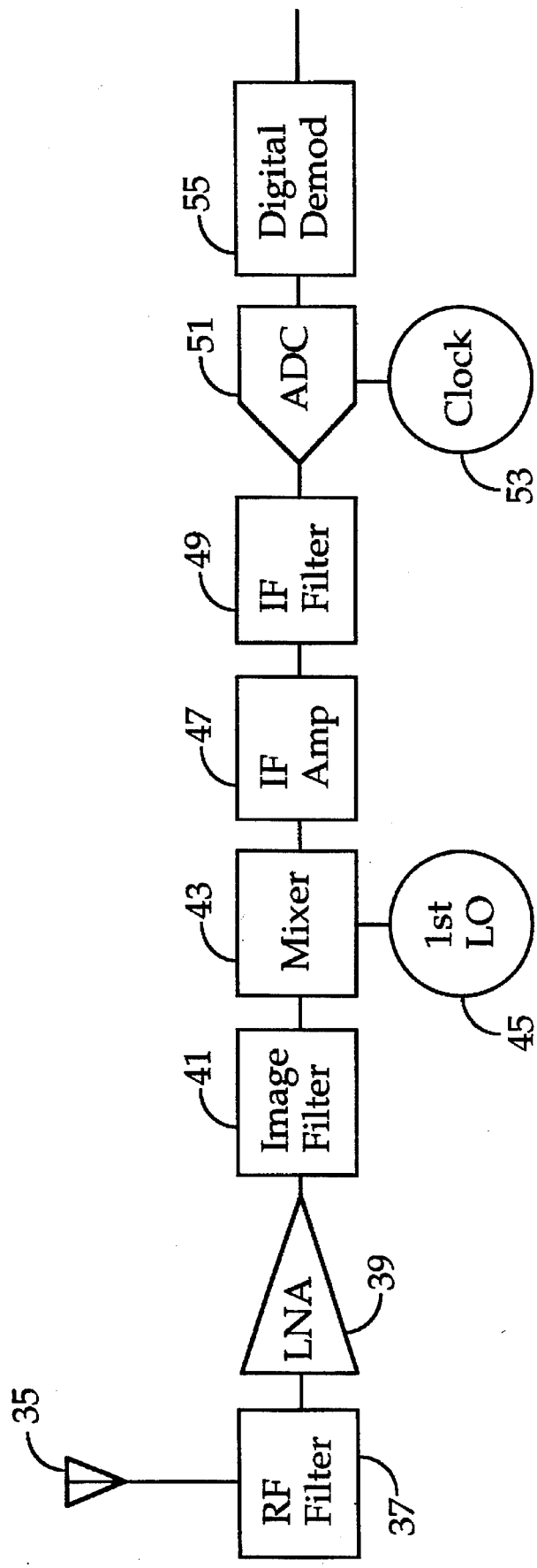
FIG. 2 is a block diagram of a digital IF receiver considered as prior art.
Figure 3:
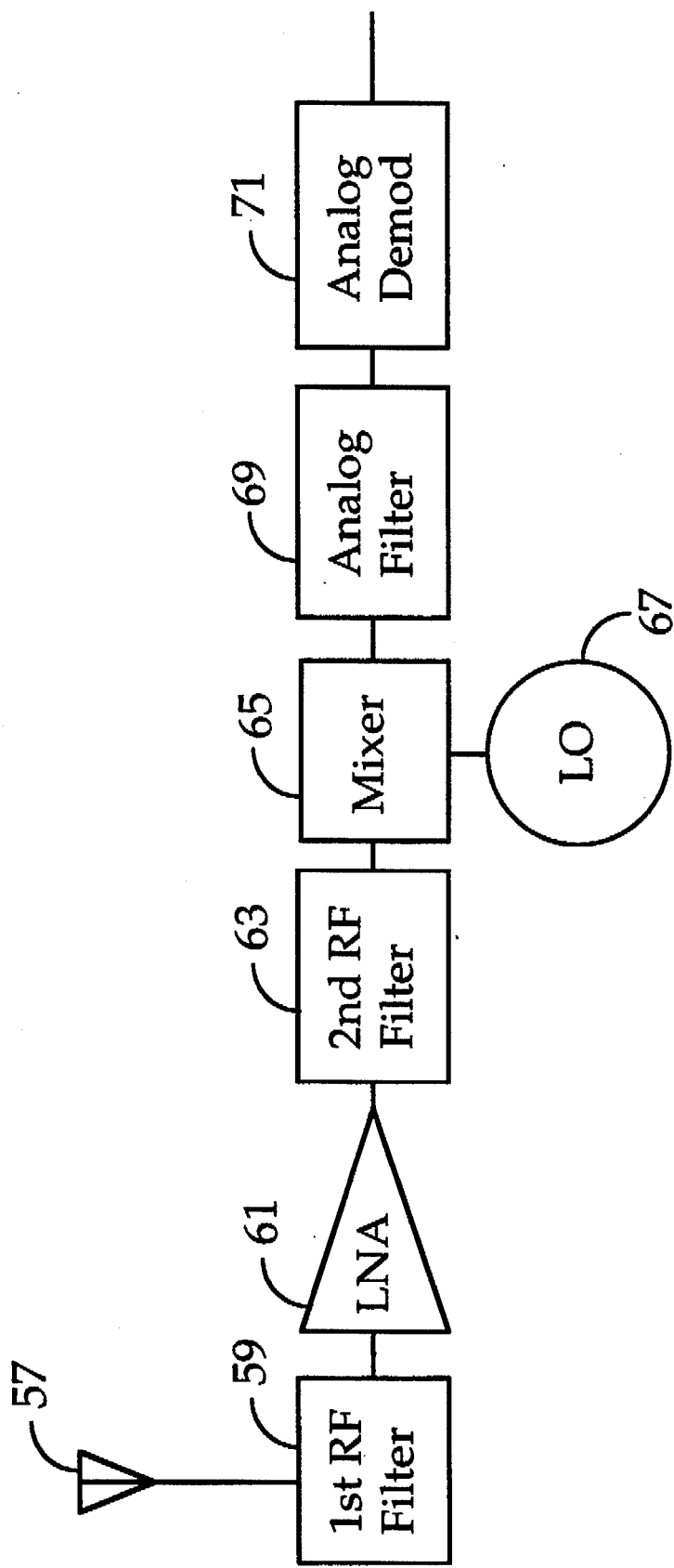
FIG. 3 is a block diagram of a direct-conversion receiver considered as prior art.
Figure 4:
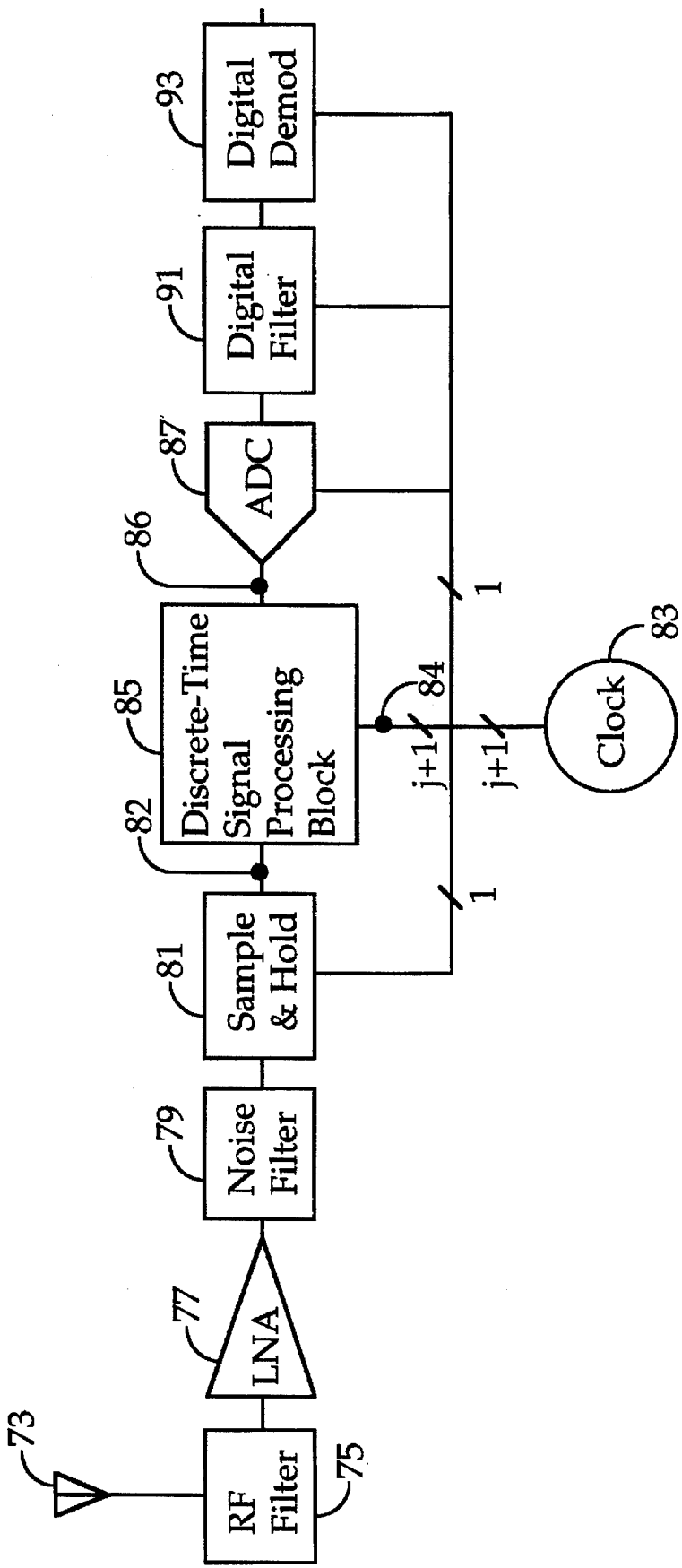
FIG. 4 is a block diagram of a receiver constructed with the principles of the invention.

FIG. 4 is a block diagram of an RF communications receiver constructed in accordance with the principles of the present invention. It includes an antenna 73 for coupling an RF signal into the input of an analog bandpass RF filter 75. The output of analog bandpass RF filter 75 connects to the input of an LNA 77 whose output couples to the input of an analog noise filter 79. The output of analog RF noise filter 79 connects to the input of a sample-and-hold circuit 81, which is built using switched-capacitor circuit techniques.

In addition to its signal input which connects to the output of RF noise filter 79, sample-and-hold circuit 81 has a clock input and a discrete-time signal output. Its discrete-time signal output connects at a node 82 to the input of a discrete-time signal processing block 85. Discrete-time signal processing block 85 is a key component of the preferred embodiment of the invention and is described in greater detail below in connection with FIG. 5.

The output of discrete-time signal processing block 85 couples through node 86 to the input of an ADC 87 whose output connects to the input of a digital filter 91. The output of digital filter 91 couples to the input of a digital demodulation circuit 93 whose digital baseband output feeds into the remainder of the communications system.

In FIG. 4, there are also connections between a clock circuit 83 and five circuit blocks that require synchronizing clock signals for proper operation. Clock circuit 83 has j+1 output lines which carry j+1 clock signals. One of these output lines from clock circuit 83 connects to sample-and-hold circuit 81 while another of these output lines from clock circuit 83 connects to ADC 87, digital filter 91, and digital demodulation circuit 93. Discrete-time signal processing block 85 also connects to clock circuit 83. The connection between these two circuits, however, is a multiple-line connection that couples through node 84 and is composed of all j+1 clock signal lines. The relationships among the clock signals delivered from clock circuit 83 to these five circuit blocks are discussed later in this description.

Figure 5:
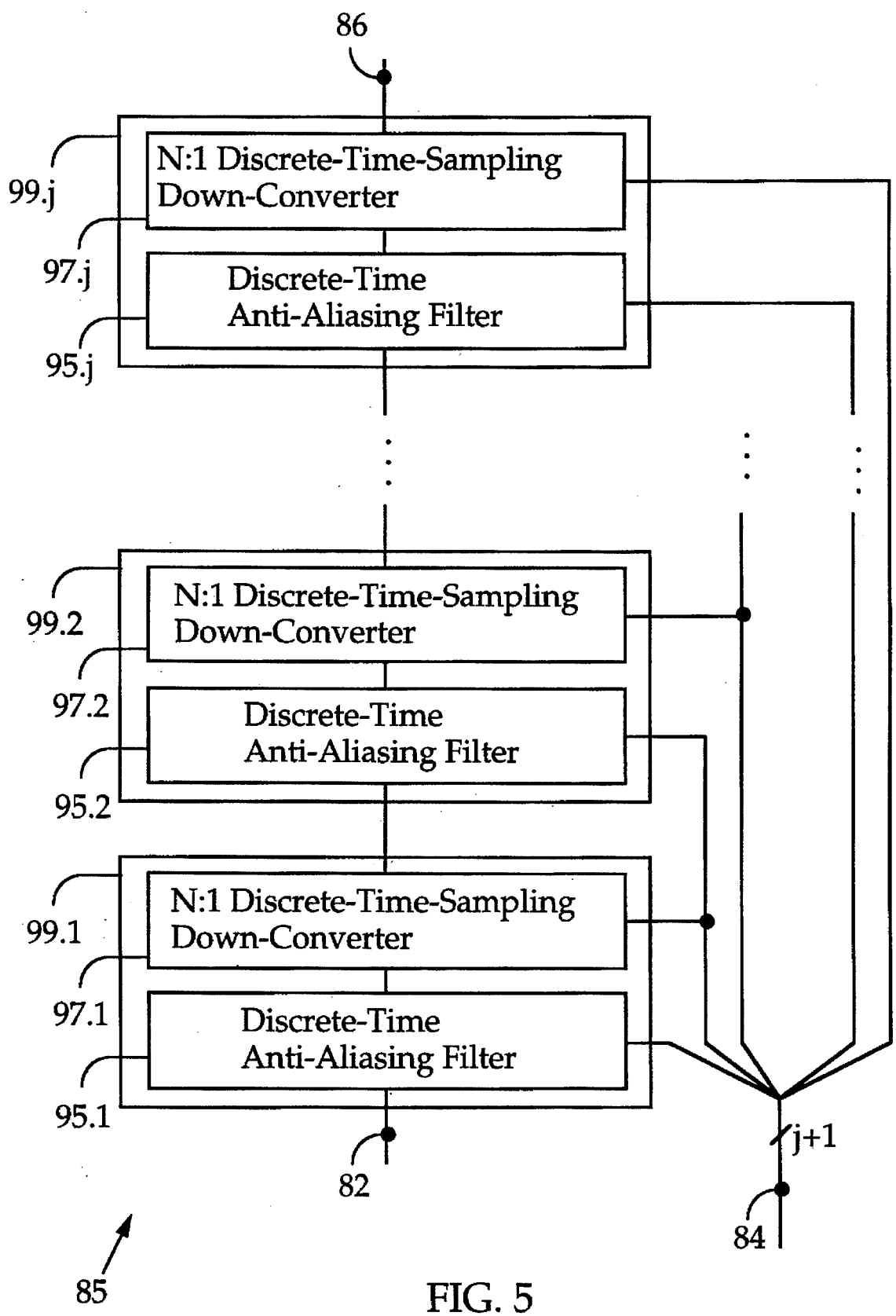
FIG. 5 is a block diagram of a discrete-time signal processing block, which is a key component of a receiver constructed according to the invention.

FIG. 5 illustrates the details of discrete-time signal processing block 85. This block is composed of j serially cascaded down-sampling stages 99.1 to 99.j. The input to down-sampling stage 99.1 serves as the input to discrete-time signal processing block 85 as a whole and connects through node 82 to the output of sample-and-hold circuit 81 of FIG. 4. Similarly, the output of down-sampling stage 99.j serves as the output to discrete-time signal processing block 85 as a whole and connects through node 86 to the input of ADC 87 of FIG. 4.

Each down-sampling stage connects to two clock signal lines. Except for the first and the last clock signal line in discrete-time signal processing block 85, each of the clock signal lines connect to two adjacent down-sampling stages. The first clock signal line that connects to discrete-time signal processing block 85 also connects to sample-and-hold circuit 81, and similarly, the last clock signal line that connects to discrete-time signal processing block 85 also connects to ADC 87, digital filter 91, and digital demodulation circuit 93. Accordingly, j+1 clock signal lines connect from the down-sampling stages through node 84 to clock circuit 83 of FIG. 4.

Because the down-sampling stages share a common structure, it is sufficient to explain the contents and connections of just one. Down-sampling stage 99.1 is composed of two circuits, a discrete-time anti-aliasing filter 95.1 and a N:1 discrete-time sampling down-converter 97.1. In the preferred embodiment, these two circuits are built using switched-capacitor circuit techniques. Within down-sampling stage 99.1, the output of discrete-time anti-aliasing filter 95.1 couples to the input of N:1 discrete-time sampling down-converter 97.1. Discrete-time anti-aliasing filter 95.1 and N:1 discrete-time sampling down-converter 97.1 each connect to a separate clock signal line from clock circuit 83. Note that the clock signal line that connects to the N:1 discrete-time sampling down-converter 97.1 also connects to discrete-time anti-aliasing filter 95.2. The other down-sampling stages 99.2 to 99.j have similar connections.

Referring back to FIG. 4, all circuit blocks in the preferred embodiment from sample-and-hold circuit 81 through digital demodulation circuit 93 as well as LNA 77 are integrated on a standard silicon chip. Because the analog bandpass RF filter 75 and the noise filter 79 are high-quality, narrowband RF filters, they are built using off-chip components. Nevertheless, this embodiment displays a higher level of integration than possible with previous receiver designs, resulting in decreased manufacture and assembly costs. Moreover, the design consumes less power than previous receiver designs since the discrete-time signal processing techniques for down-conversion require no external IF filtering components, no high-frequency mixers or LOs, and no high-speed analog-to-digital converters.

Figure 6:
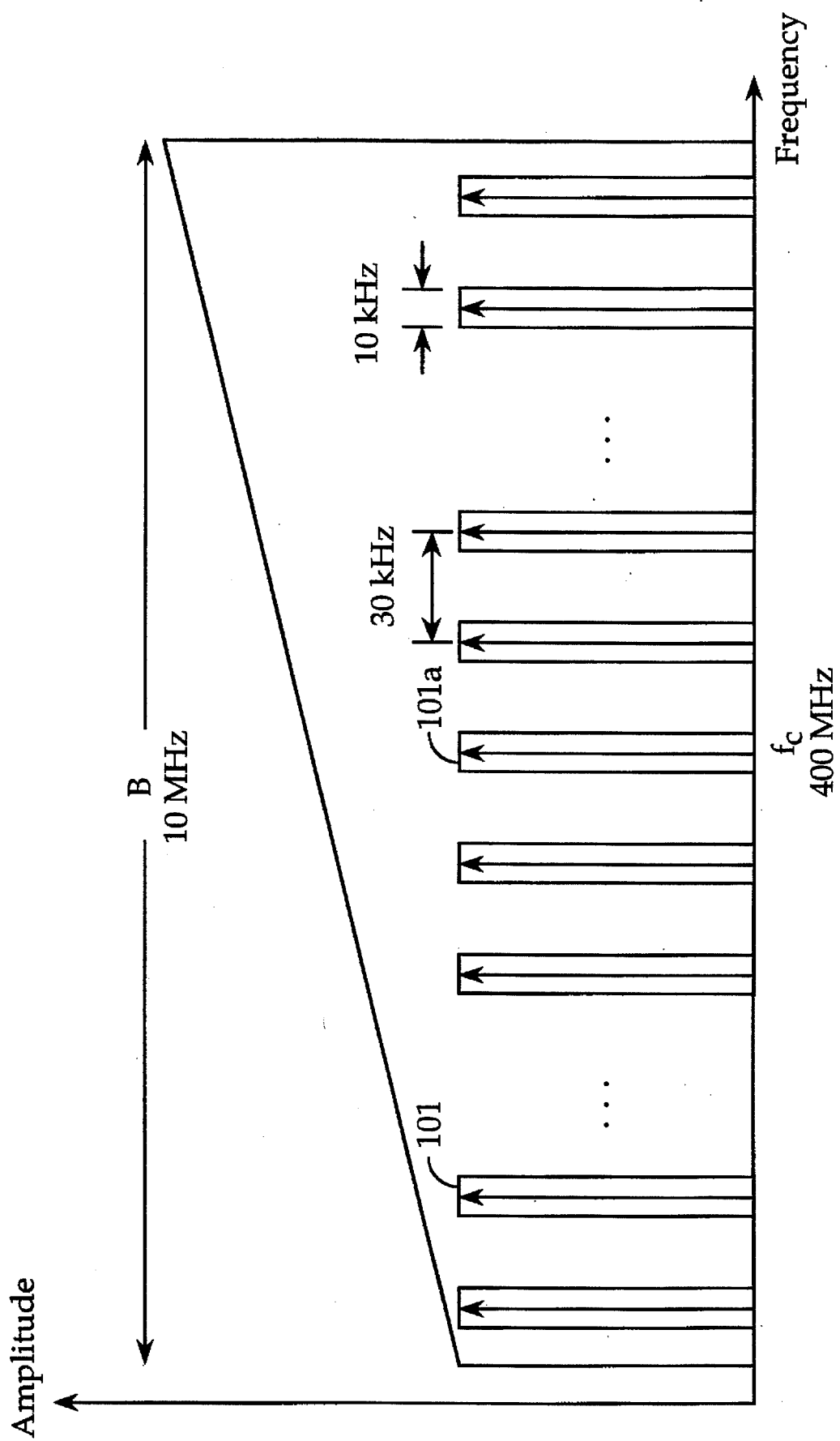
FIG. 6 is a graph showing a typical arrangement of RF channels within a channel allocation band used for common radio communications.

FIG. 6 illustrates the characteristics of the RF communication signal of interest for the preferred embodiment. The following description illustrates the reception (down-conversion, filtering, and amplification) of a single analog voice channel 101a chosen from a set of analog voice channels 101 contained in a channel allocation band of bandwidth B. For the sake of definiteness, it is assumed that B=10 MHz and that voice channel 101a is positioned in the center of the band with carrier frequency $f_c$=400 MHz. It is also assumed that each channel in the band has a 10 kHz information bandwidth and is separated from adjacent channels by 30 kHz. These values are specially chosen merely to help elucidate the relationships involved in the down-conversion and filtering, and those skilled in the art will understand that the present method of RF signal reception does not depend on these specific values.

DESCRIPTION OF THE PREFERRED EMBODIMENT—OPERATION

The operation of an RF communications receiver constructed in accordance with the principles of the present invention is as follows.

Referring to FIG. 4, an antenna 73 couples RF signal energy into the input of an analog bandpass RF filter 75. Analog bandpass RF filter 75 is used to selectively pass a channel allocation band of bandwidth B while attenuating RF energy at frequencies outside this band, thereby producing a band-limited RF signal which includes a specific channel having carrier frequency $f_c$.

The band-limited RF signal then passes from the output of analog bandpass RF filter 75 to the input of LNA 77 which amplifies the signal while contributing minimal noise. The amplified RF signal from the output of LNA 77 is then coupled to RF noise filter 79. This RF noise filter 79 has a response similar to that of analog bandpass RF filter 75. It passes a bandwidth B of signal frequencies in the channel allocation band while attenuating any RF energy that lies outside this bandwidth, such as energy that may have been produced or amplified by LNA 77. This noise filter improves the performance of the receiver by preventing excessive noise from folding into the channel of interest when down-conversion is performed further along in the receiver.

Although filters 75 and 79 efficiently pass signals within the passband of bandwidth B they also pass non-negligible signals in a larger, anti-aliasing bandwidth W including the passband of interest. (See FIGS. 9A and 9B) This anti-aliasing bandwidth W arises from the combined roll-off of the two filter responses determined by their quality factors. To minimize W, analog bandpass RF filter 75 and noise filter 79 must be high-quality filters built using off-chip components. LNA 77, however, can be integrated along with the rest of the receiver. The passband gain and noise performance of the front-end components from antenna 73 through sample-and-hold circuit 81 determine the noise figure and sensitivity of the receiver.

Figure 7:
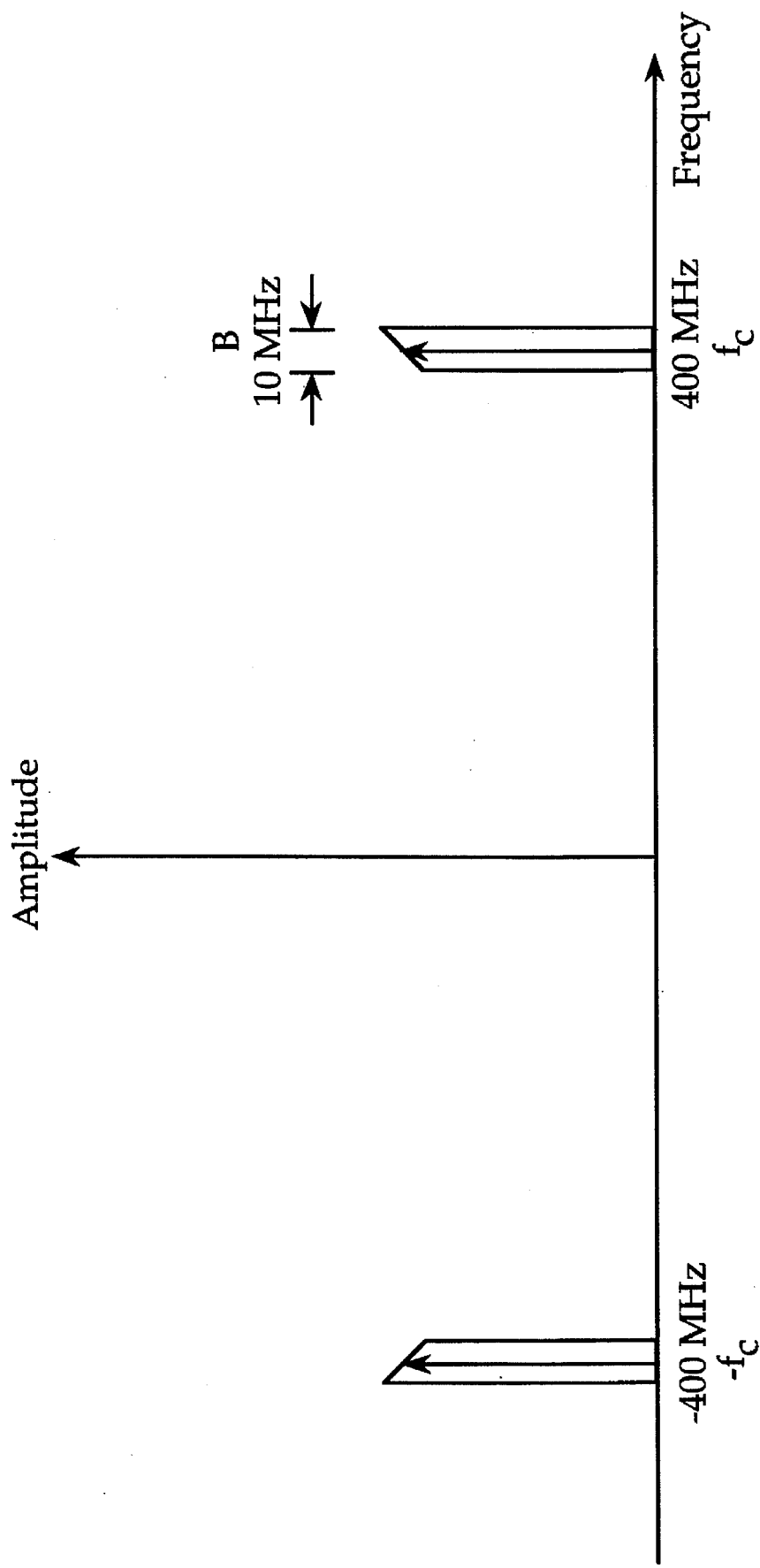
FIG. 7 is a graph showing the band-limited RF signal after passing through the noise filter of FIG. 4 according to the invention.
Figure 8:
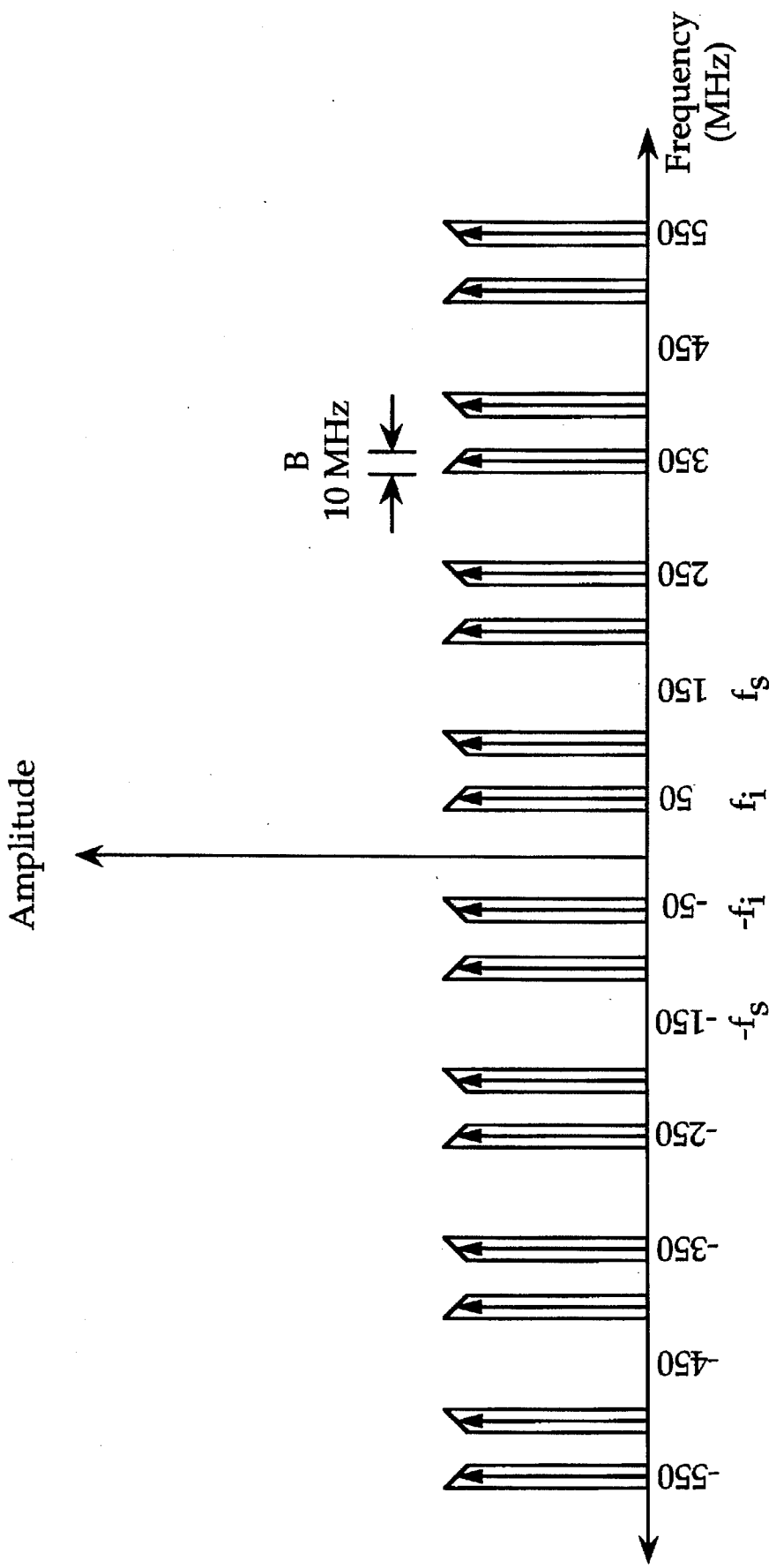
FIG. 8 is a graph showing the spectrum of image signals after the band-limited RF signal is sub-sampled according to the invention.

After passing through RF noise filter 79, the band-limited RF signal couples into the input of sample-and-hold circuit 81 which also receives a clock signal of frequency $f_s$ from clock generator circuit 83. This clock signal determines the sampling rate of sample-and-hold circuit 81. Because the sampling rate $f_s$ is less than the RF carrier frequency $f_c$, sub-sampling will occur. In accordance with the principles of Fourier theory, the discrete-time signal produced at the output of sample-and-hold circuit 81 will contain infinite replicas of the band-limited RF signal, each centered at an image signal frequency $f_i=nf_s \pm f_c$, where n is an integer. The original signal is shown in FIG. 7 and its replication is shown in FIG. 8. By selecting the lowest frequency image signal, i.e., by choosing the integer n that minimizes [$f_i$], this process effectively down-converts, or frequency translates, the RF signal to an image signal at a lower frequency $f_i$.

Figure 9:
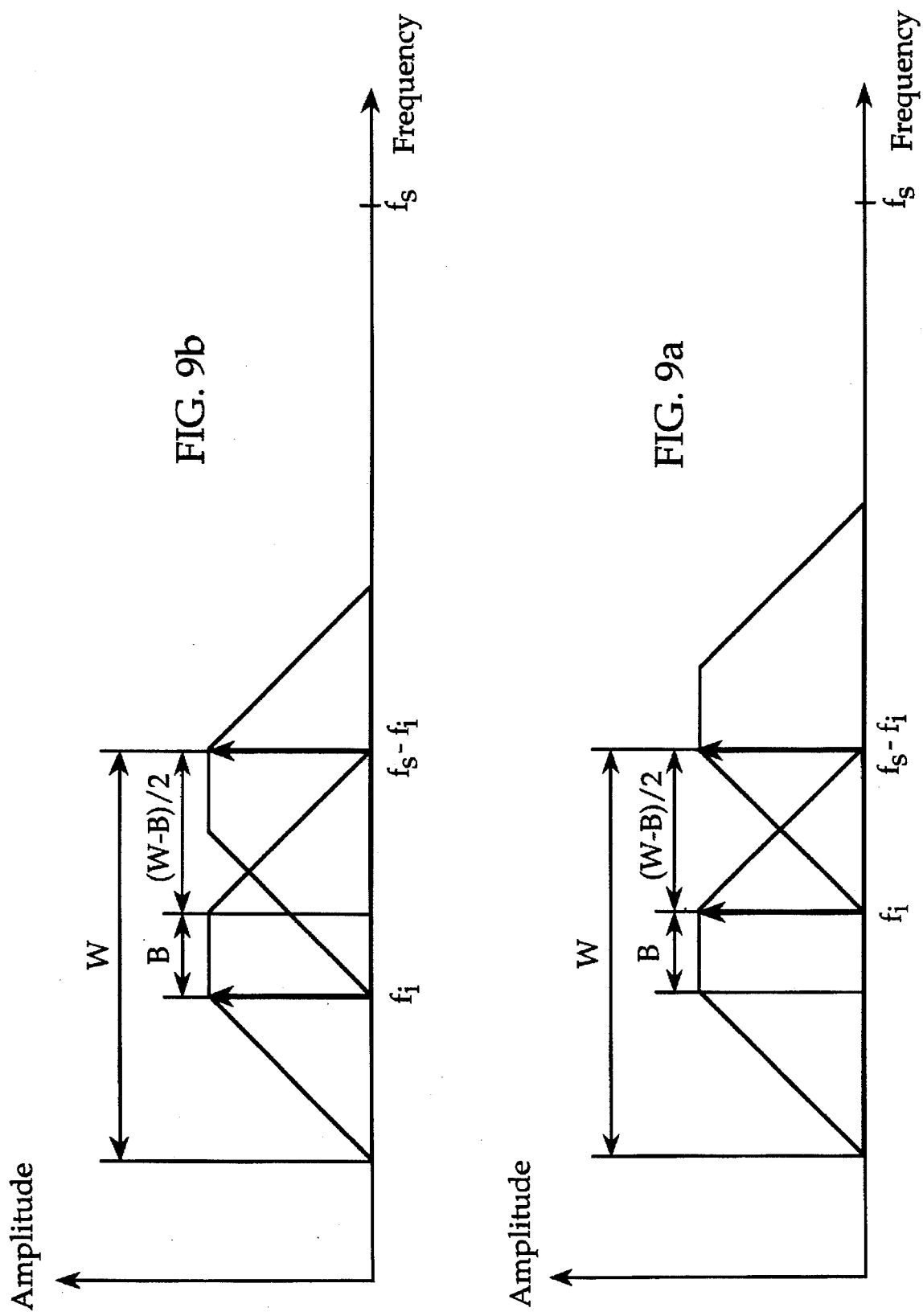
FIGS. 9a and 9b are graphs illustrating the necessary relationships between $f_s$, $f_i$, B, and W to permit sub-sampling without destructive aliasing.

The sampling rate, $f_s$, must be set above a minimum rate to avoid destructive aliasing during the sub-sampling process. This minimum rate is determined by both the bandwidth B of the allocation band and the bandwidth W of the front-end RF filters. To avoid aliasing an image channel of frequency $f_i$ in the image signal band, the image channel must not overlap with the outer tail of the envelope of the adjacent image signal band which contains the corresponding image channel of frequency $f_s-f_i$. The lower bound on the difference between $f_s-f_i$ and $f_i$ depends on the position of the channel within the band. FIGS. 9a and 9b show the overlap between adjacent image bands in the best case and in the worst case, respectively. In the worst case, there is no overlap whenever $f_s-2f_i>(W+B)/2$. In the preferred embodiment, B=10 MHz and W=80 MHz, so we require $f_s-2f_i>45$ MHz. For reasons discussed below, the preferred embodiment selects $f_i=f_s/3$, so the constraint $f_s-2f_i>45$ MHz implies $f_s>135$ MHz, and the constraint $f_i=nf_s \pm f_c$ implies $f_s= \pm 3f_c/(3n-1)=1200$ MHz, 600 MHz, 300 MHz, 240 MHz, 171 MHz, 150 MHz, 120 MHz, 109 MHz, 92 MHz, ... Thus the lowest frequency image signal that avoids destructive aliasing is $f_s=150$ MHz (n=3). Consequently, $f_i=50$ MHz.

After sampling the band-limited RF signal at rate $f_s$, sample-and-hold circuit 81 couples the discrete-time signal through node 82 into the input of discrete-time signal processing block 85. This discrete-time signal processing block simultaneously performs anti-alias filtering, channel-select filtering, amplification, and frequency down-conversion of the signal in j successive steps, ultimately selecting and isolating analog voice channel 101a from within the channel allocation band and translating it in frequency down to a low-frequency signal of frequency $f_k$.

The selection of different channels from within the RF channel allocation band is accomplished by adjusting the sample rate $f_s$ produced by clock circuit 83 of FIG. 4. Since all clock lines leading from clock circuit 83 deliver a coherent synchronizing signal of frequency $f_s$ or an integral fraction thereof, all the discrete-time and digital circuit blocks 99 in FIG. 5 which are connected to clock circuit 83 through node 84 will track the changes in $f_s$. Accordingly, as the value of $f_s$ is varied, different RF channels will be tuned by the same down-conversion, filtering, and amplification process as for the RF channel having $f_c=400$ MHz.

Figure 11:
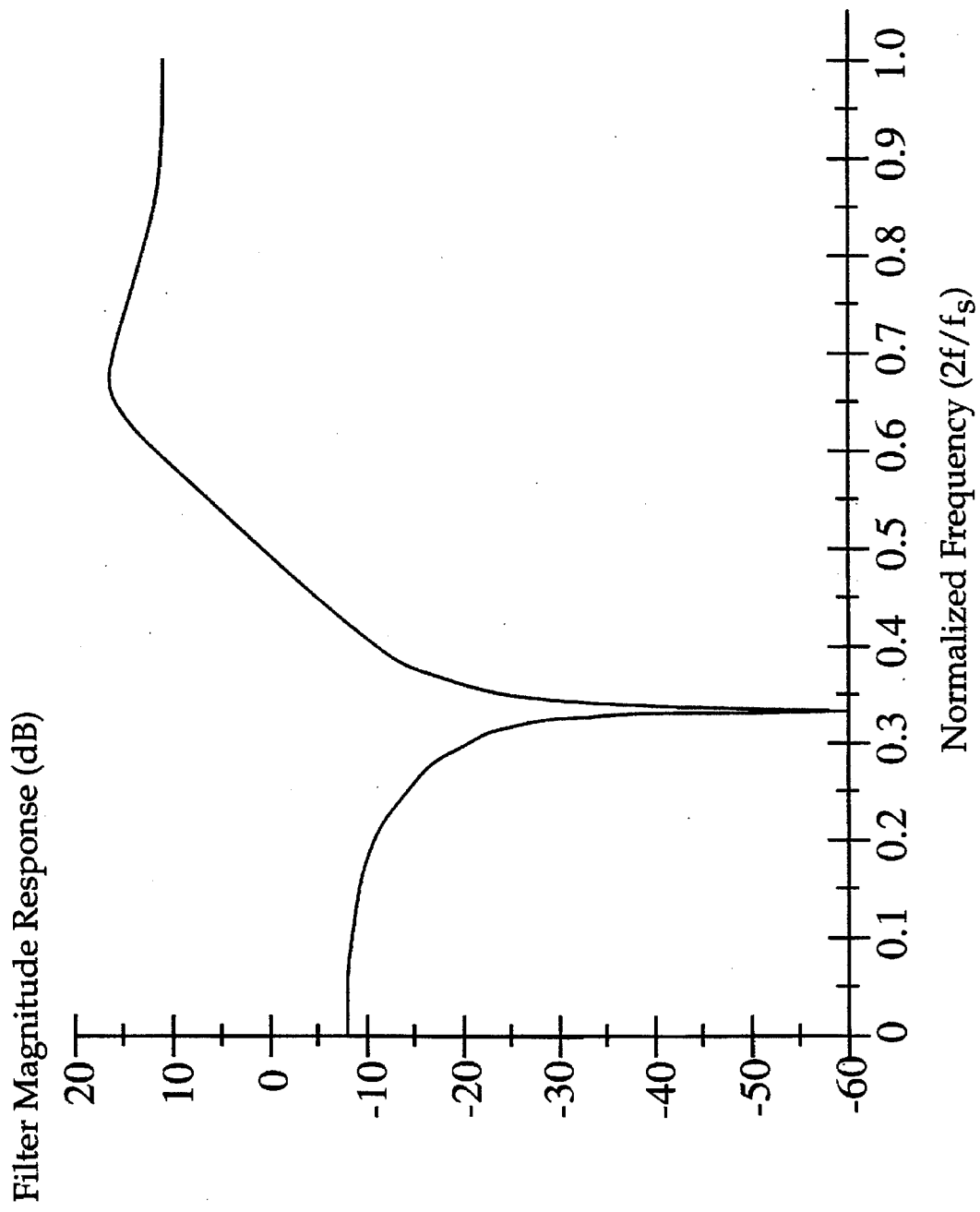
FIG. 11 is a graph showing the normalized frequency response of the discrete-time anti-aliasing filters used in the preferred embodiment.

Referring to FIG. 5, upon coupling through node 82 into discrete-time signal processing block 85, the discrete-time signal enters down-sampling stage 99.1. Inside down-sampling stage 99.1, the discrete-time signal passes through anti-aliasing filter 95.1, which is driven by a clock signal coupled through node 83 to operate at a rate $f_s$ equal to that of sample and hold circuit 81 of FIG. 4. Anti-aliasing filter 95.1 removes from the discrete-time signal all frequencies that would otherwise alias onto the desired channel during down-sampling and amplifies the remaining desired frequencies. The frequency response of anti-aliasing filter 95.1 used in the preferred embodiment is shown in FIG. 11 where the frequency axis is normalized to half its 150 MHz clock rate.

The filtered and amplified discrete-time signal then couples into an N:1 discrete-time sampling down-converter 97.1. The N:1 discrete-time sampling down-converter 97.1 is a sample-and-hold circuit with a sampling rate of $f_s/N$, where N, the down-sampling ratio, is an integer greater than one. After being down-sampled by a factor of N, the signal then passes into down-sampling stage 99.2. In the preferred embodiment N=2 since this results in the simplest response for the anti-aliasing filters. The use of a higher value for the down-sampling ratio N would require the use of a more complex anti-aliasing filter with more than one notch in its frequency response for removing the additional interfering signals that could alias onto the desired channel during down-sampling. The higher the value of N, the greater the number of normalized frequencies that would have to be notched out. Accordingly, as N increased, the order of the discrete-time anti-aliasing filters would also have to increase. In order to maintain simplicity, a lower down-sampling ratio is preferable, especially for the down-sampling stages in the high-speed front end. This ensures that an integrated filter is realizable.

Because the other down-sampling stages 99.2 through 99.j function similarly to down-sampling stage 99.1, their operation on the discrete-time signal need not be individually explained. It is important to understand, however, that each discrete-time anti-aliasing filter 95.i is driven by clock circuit 83 to operate at a clock rate equal to the sampling rate of the N:1 discrete-time sampling down-converter 97.i-1 that preceded it. Additionally, each successive down-sampling stage 99 is driven by clock circuit 83 to operate at a clock or sampling rate N times lower than the previous down-sampling stage. Thus, in the preferred embodiment where N=2, each successive down-sampling stage operates at half the rate of the previous down-sampling stage. In this way, the discrete-time signal is successively down-converted in frequency. Additionally, the desired channel is successively amplified and filtered in order to separate it from the other channels originally present in the band-limited RF signal.

The ratio of signal frequency to sample rate is critical in the design of the anti-aliasing filters in the down-sampling stages. In order to perform anti-alias filtering in the discrete-time domain, it is necessary to ensure that the desired channel and aliasing interfering signals are separated as much as possible in frequency. This allows the separation between the stop band and pass band to be sufficiently large so that a low-order filter can be feasibly designed. Additionally, since many down-sampling stages are used, it is necessary to ensure that the separation between the stop band and pass band remains reasonable after many stages. As the bandwidth of the desired channel becomes a significant fraction of the sample rate, a low-order filter is no longer sufficient for anti-aliasing because to properly prevent aliasing, the stop band must be wider than the bandwidth of the desired channel. At this point, however, the signal is shifted sufficiently down in frequency to make digital processing practical.

Figure 10:
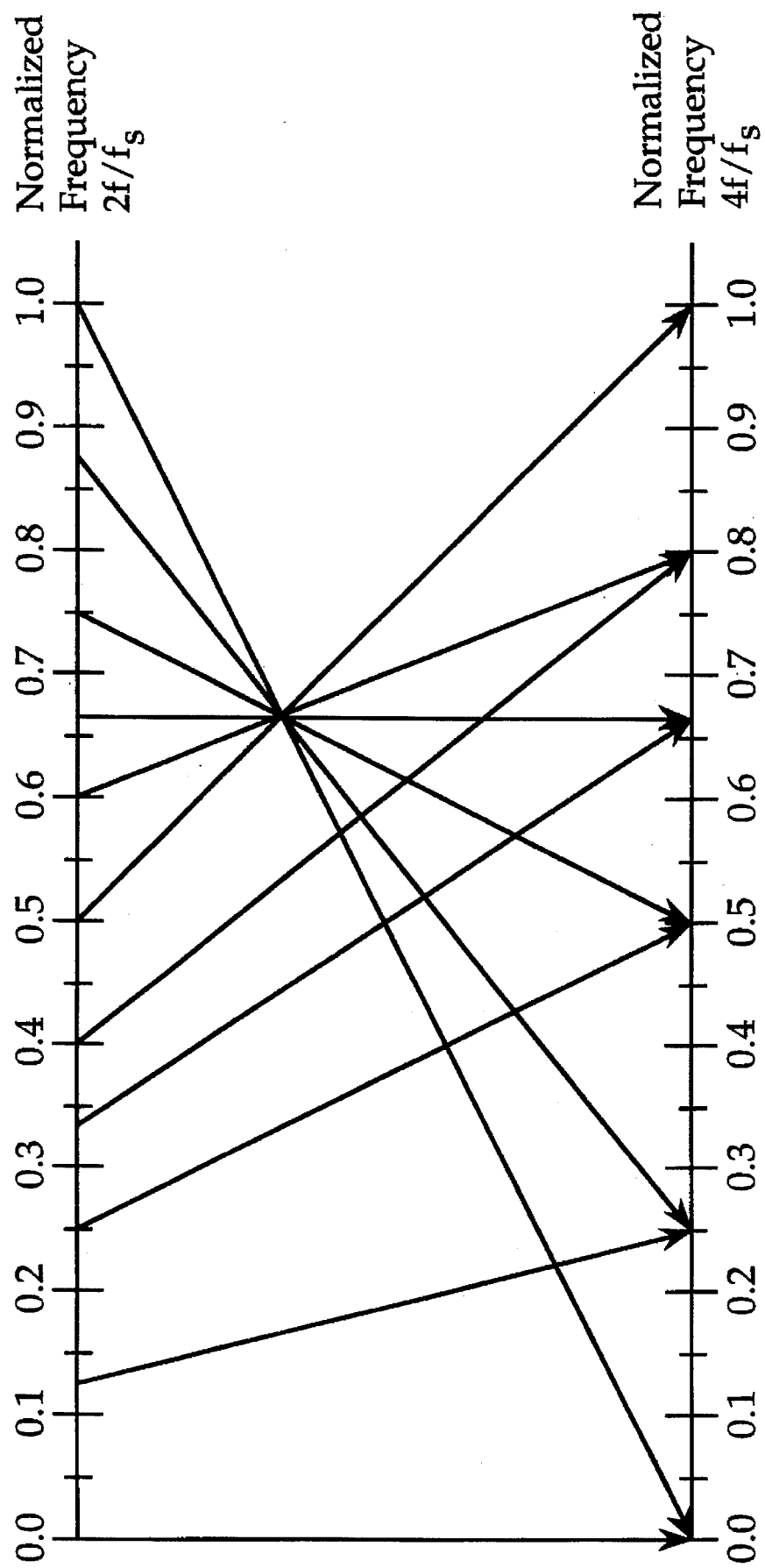
FIG. 10 pictorially illustrates the aliasing of spectral components due to 2:1 down-sampling.

A frequency map showing the effect of 2:1 down-sampling is shown in FIG. 10. The upper frequency axis shows the signal frequency location of discrete-time signals just before being sampled by a 2:1 discrete-time sampling down-converter. The signal frequencies are normalized to the sampling rate of the 2:1 discrete-time sampling down-converter. The lower frequency axis shows the frequency spectrum just after down-sampling, normalized to the sampling rate of the next 2:1 discrete-time sampling down-converter. The arrows indicate the mapping of normalized frequency as a result of down-sampling. Each value of frequency aliases with exactly one other value of frequency that is located symmetrically about the point f=0.5.

For the preferred embodiment in which N=2, there are two special locations for the channel frequency: a normalized frequency of 4/5 and a normalized frequency of 2/3. For the channel frequency located at a normalized frequency of 4/5, the component that aliases onto the channel is located at a frequency of 1/5. After 2:1 down-sampling, the signal moves to a frequency of 2/5, and the aliasing frequency for the next stage of down-sampling is located at 3/5. After one more stage of down-sampling, the desired channel moves back up to a normalized frequency of 4/5, and the cycle can be continued until the signal bandwidth reaches the range 3/10 to 1/2 (0.3 to 0.5). At this point, it becomes impossible to remove the aliasing components in the next stage of down-sampling with a discrete-time filter. The use of the normalized frequency of 4/5 therefore requires the alternating use of two different discrete-time anti-aliasing filter designs.

For the case in which the desired channel is located at a normalized frequency of 2/3, the aliasing frequency is located at a frequency of 1/3. After 2:1 down-sampling, the desired channel remains at a normalized frequency of 2/3 with respect to the sampling rate of the next down-sampling stage. Thus, the desired channel never changes location relative to the sampling frequency. This is a particularly advantageous result because anti-aliasing filters with similar responses can be used in all the down-sampling stages. This down-sampling can be continued until the channel bandwidth spans the range 1/2 to 5/6 (0.5 to 0.833) after which it becomes impossible to anti-alias filter in the discrete-time domain. For these reasons, the preferred embodiment uses this value of 2/3 for the location of the desired channel in normalized frequency. Consequently, the preferred embodiment selects $f_i=2/3(f_s/2)=f_s/3$. In other embodiments it may be desirable to relax this requirement slightly to obtain, for example, $f_s/4<f_i<f_s/2$.

Referring now back to FIG. 4, after the desired channel progresses through all the down-sampling stages 99 (FIG. 5), it appears at the output of discrete-time signal processing block 85 as a low-frequency discrete-time signal of frequency $f_k$ and couples through node 86 into the input of ADC 87. ADC 87 samples and digitizes the signal at a conversion rate determined by clock circuit 83. In the preferred embodiment, this clock rate is the same as the sampling rate of the final 2:1 discrete-time sampling down-converter in discrete-time signal processing block 85, and is therefore low enough that ADC 87 does not consume large amounts of power. The digital representation of the desired channel is now passed into a digital filter 91 which performs the final channelization filtering of the desired channel before passing it on to a digital demodulator 93. Digital demodulator 93 demodulates the desired channel, extracting its information content onto a digital baseband output signal which it passes on to the rest of the communications system.

The present invention is described through a specific preferred embodiment. This merely serves the purpose of facilitating the description of the principles of the present invention and in no way is meant to limit its scope. Those skilled in the art will realize that many changes and modifications can readily be made to the preferred embodiment without departing from the principles of the invention.

For example, instead of using switched-capacitor techniques to build the sample-and-hold circuits, the discrete-time anti-aliasing filters, and the N:1 discrete-time sampling down-converters, these components may be built using switched-current circuits or other techniques.

Although the preferred embodiment performs the analog-to-digital conversion after the down-conversion, it is possible to perform the analog-to-digital conversion earlier in the receiver, such as just after sample-and-hold circuit 81. The successive down-conversion and filtering stages would then be implemented in the digital domain using digital filtering and decimation techniques. This option will become increasingly attractive as analog-to-digital conversion technology improves.

Those skilled in the art will also understand the applicability of the present invention to RF channels with different characteristics than those chosen for the preferred embodiment. The present invention is applicable to a large range of RF carrier frequencies, limited only by technology. Also, the present invention is applicable to many other channel allocation band configurations containing any number of channels, each of arbitrary bandwidth. Moreover, the method may be used with any type of modulation including, for example, AM, FM, phase modulation, and digital forms of modulation such as quadrature amplitude modulation, phase shift keying, Gaussian minimum shift keying, and frequency shift keying. Additionally, those skilled in the art will recognize the choices available in the selection of the sampling frequency, the selection of the down-converting ratio, the optional use of LNA 77, the trade-offs in frequency response characteristics between analog bandpass RF filter 75 and RF noise filter 79, and the selection of the number of down-sampling stages. These and other modifications which are obvious to those skilled in the art are intended to be included within the scope of the present invention. Accordingly, the scope of the invention should be determined not by the embodiment described, but by the appended claims and their legal equivalents.

We claim:

1. A method for filtering and frequency translating an RF signal containing an RF channel of carrier frequency $f_c$ to yield a low-frequency signal containing a down-converted channel of frequency $f_k$, the method comprising:

filtering the RF signal to yield a band-limited signal of bandwidth W, the band-limited signal containing a channel allocation band of bandwidth B, where the channel allocation band contains the RF channel;

discrete-time sampling the band-limited signal at a sampling frequency $f_s$ to yield an image signal that contains an image channel of frequency $f_i$, where $f_i<f_s<f_c$;

discrete-time down-converting and down-sampling the image signal using sub-sampling to yield the non-zero-frequency, low-frequency signal containing the down-converted channel of frequency $f_k>0$.

2. The method of claim 1 wherein
$f_i=$mfk for a rational number m,
$f_s-2f_i>(W+B)/2$, and
$f_i=nf_s±f_c$ for an integer n which minimizes $|f_i|$.

3. The method of claim 1 wherein $f_s/4<f_i<f_s/2$.

4. The method of claim 3 wherein $f_i=f_s/3$.

5. The method of claim 1 wherein the down-converting step comprises:

discrete-time notch or bandpass filtering the image signal to prevent interfering aliasing; and down-sampling the image signal to shift the image signal down in frequency and sample rate.

6. The method of claim 5 wherein the down-sampling step comprises successively down-sampling the image signal by factors of two.

7. The method of claim 5 wherein the discrete-time filtering step comprises amplifying the signal.

8. The method of claim 1 further comprising digitizing the low-frequency signal containing the down-converted channel.

9. A radio receiver comprising:

a receiving means for receiving an RF signal containing an RF channel of carrier frequency $f_c$ within a channel allocation band having bandwidth B;

a filtering means for filtering the RF signal to a bandwidth W to yield a band-limited signal, the band-limited signal containing the channel allocation band;

a discrete-time sampling means for sampling the band-limited signal at a sampling frequency $f_s$ to yield an image signal containing an image channel of frequency $f_i$, where $f_i < f_s < f_c$;

a discrete-time down-converting means for down-converting and down-sampling the image signal using sub-sampling to yield a non-zero-frequency, low-frequency signal containing a down-converted channel of frequency $f_k$, where $0 < f_k < f_i$;

a discrete-time channel-select filtering means for removing adjacent-channel interference from the low-frequency signal to isolate the down-converted channel; and a demodulation means for demodulating the down-converted channel to yield a baseband signal.

10. The radio receiver of claim 9 wherein $f_i = mf_k$ for a rational number m, $f_s - 2f_i > (W+B)/2$, and $f_i = nf_s \pm f_c$ for an integer n which minimizes $|f_i|$.

11. The radio receiver of claim 9 wherein $f_s/4 < f_i < f_s/2$.

12. The radio receiver of claim 11 wherein $f_i = f_s/3$.

13. The radio receiver of claim 9 wherein the down-converting means comprises:

a discrete-time notch or bandpass filtering means for anti-alias filtering the image signal; and a down-sampling means for shifting the image signal down in frequency and sample rate.

14. The radio receiver of claim 13 wherein the down-sampling means comprises a 2:1 discrete-time sampling down-converter.

15. The radio receiver of claim 13 wherein the discrete-time filtering means includes an amplifying means.

16. The radio receiver of claim 9 further comprising a digitizing means for digitizing the low-frequency signal containing the down-converted channel.

17. The radio receiver of claim 9 wherein the demodulation means comprises a demodulator chosen from the group consisting of an AM demodulator, an FM demodulator, a phase modulation demodulator, a quadrature amplitude modulation demodulator, a phase shift keying demodulator, a Gaussian minimum shift keying demodulator, and a frequency shift keying demodulator.

18. A method for filtering and frequency translating an RF signal containing an RF channel of carrier frequency $f_c$ to yield a non-zero-frequency, low-frequency signal, the low frequency signal containing a down-converted channel of frequency $f_k > 0$, the method comprising:

(a) filtering the RF signal to yield a band-limited signal of bandwidth W, the band-limited signal containing a channel allocation band of bandwidth B, where the channel allocation band contains the RF channel;

(b) discrete-time sampling the band-limited signal at a sampling frequency $f_s$ to yield an image signal that contains an image channel of frequency $f_i$, where $f_i < f_s < f_c$;

(c) discrete-time filtering the image signal to remove adjacent-channel interference and unwanted aliasing interference and thereby further isolate the image channel from within the image signal to produce a discrete-time filtered image signal;

(d) discrete-time sub-sampling the discrete-time filtered image signal to simultaneously shift in frequency and reduce the sample rate of the discrete-time filtered image signal;

(e) repeating steps (c) and (d) in order to down-convert the image signal to yield the low-frequency signal containing the down-converted channel of frequency $f_k > 0$.

19. The method of claim 18 wherein $f_i = mf_k$ for a rational number m, $f_s - 2f_i > (W+B)/2$, and $f_i = nf_s \pm f_c$ for an integer n which minimizes $|f_i|$.

20. The method of claim 18 wherein $f_s/4 < f_i < f_s/2$.

21. The method of claim 20 wherein $f_i = f_s/3$.

22. The method of claim 18 wherein the sub-sampling step comprises down-sampling the image signal by a factor of two.

23. The method of claim 18 wherein the discrete-time filtering step comprises amplifying the signal.

24. The method of claim 18 further comprising digitizing the low-frequency signal.

* * * * *